United States Patent [19]

Shepherd et al.

[11] Patent Number: 4,458,003

[45] Date of Patent: Jul. 3, 1984

[54] PHOTOSENSITIVE MATERIALS FOR USE IN MAKING DRY TRANSFERS

[75] Inventors: John V. Shepherd; John S. Thornley; both of Ashford, England

[73] Assignee: Esselte Pendaflex Corp., Garden City, N.Y.

[21] Appl. No.: 499,806

[22] Filed: Jun. 1, 1983

[30] Foreign Application Priority Data

Jun. 7, 1982 [GB] United Kingdom ................ 8216503

[51] Int. Cl.³ .......................... G03C 1/71; G03C 1/68; G03F 1/02
[52] U.S. Cl. ..................................... 430/253; 430/273
[58] Field of Search ............................................ 430/253

[56] References Cited

U.S. PATENT DOCUMENTS

| | | |
|---|---|---|
| 3,615,435 | 10/1971 | Chu et al. ............................ 430/253 |
| 3,770,438 | 11/1973 | Celeste ................................ 430/253 |
| 4,050,936 | 9/1977 | Takeda et al. ...................... 430/253 |
| 4,288,525 | 9/1981 | Shepherd et al. .................. 430/253 |
| 4,347,300 | 8/1982 | Shimazu et al. .................... 430/253 |

Primary Examiner—Richard L. Schilling
Attorney, Agent, or Firm—Darby & Darby

[57] ABSTRACT

Photosensitive materials for use in the making of dry transfer material are described which comprise two carrier sheets which may be peeled apart and three interlayers. The central interlayer is an image-forming layer e.g. a pigmented polymer with a photocrosslinkable or photopolymerizable layer on one side and an adhesive layer on the other side. A dry transfer is obtained by imagewise exposing through a photographic positive and peeling apart the carrier sheets. Thereafter the material is further irradiated e.g. with UV light, to give a dry transfer material.

8 Claims, 2 Drawing Figures

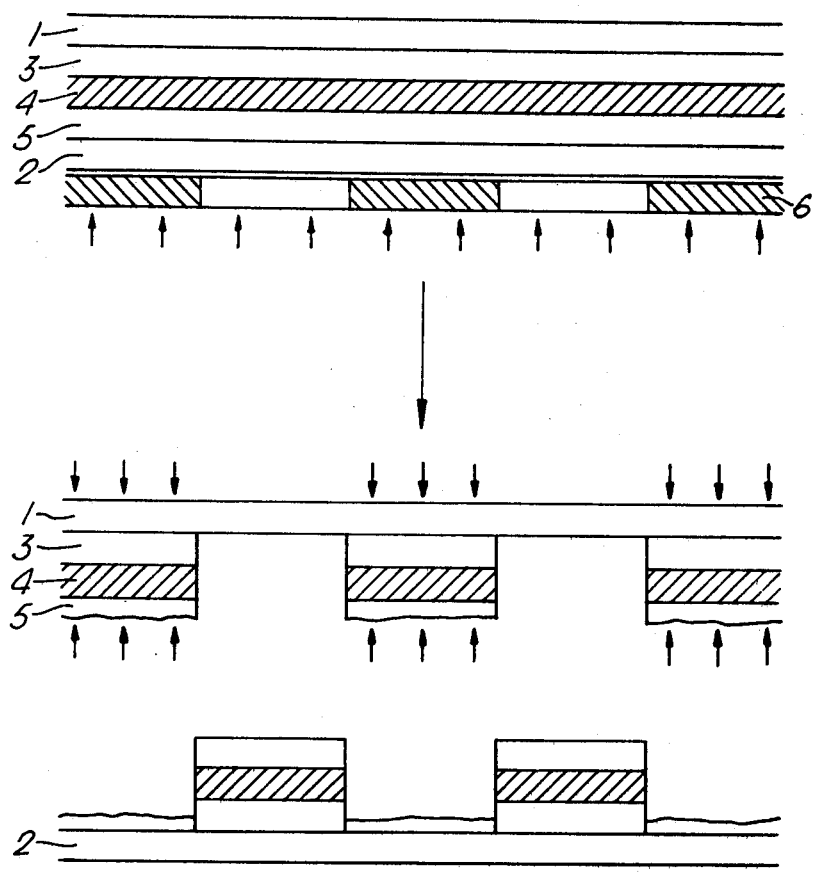

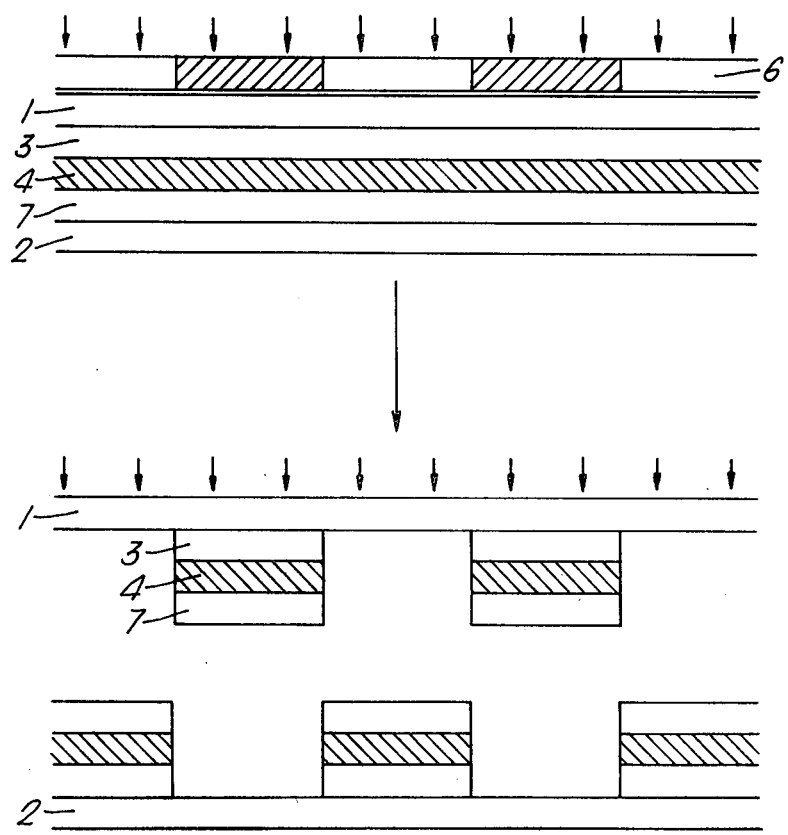

PHOTOSENSITIVE MATERIALS FOR USE IN MAKING DRY TRANSFERS

This invention relates to photosensitive materials for use in making dry transfer materials easily and quickly.

Dry transfer materials have been made for many years by standard printing techniques, usually silk screen printing. The inherent disadvantages of that technique (basically its inflexibility and poor economy unless the runs of materials were substantial) have led to the development of a variety of systems for making dry transfer materials photographically. British Patent Specification Nos. 1079661, 1291960, 1364627, 1441982 and 1546753 are examples of approaches to this problem.

One particular area to which attention has been directed is the development of photosensitive materials which when imagewise exposed can be "developed" without the aid of developer liquids. Rather than by chemical means, the images of such materials are developed mechanically. The materials generally comprise two carrier sheets have photosensitive material sandwiched therebetween which carrier sheets, after imagewise exposure, are peeled apart to give the desired image adhering to a carrier sheet.

A practical problem of such materials for the production of dry transfer materials is the conflicting requirements placed on the transferable image material which constitutes the indicium or other sign in the final transfer material. In order that such an indicium may be transferred from the final transfer material using the normal dry transfer technique of rubbing over the back of a carrier sheet in the area of the indicium using a stylus e.g. a ball-point pen, it is necessary that the indicia adhere not too strongly to the carrier sheet. However, in order to enable the manufacture of that indicium, it must adhere to the carrier sheet which constitutes the carrier of the final transfer material more strongly than it does to the other of the original carrier sheet pair forming usually the outer layers of the photosensitive material which is imagewise exposed.

These conflicting requirements lead to a necessity of balancing the various interlayer adhesions very carefully in such materials. This is not easy even when the materials are freshly made, and ageing effects tend to occur which change the interlayer adhesions, thus complicating the position still further.

U.S. Pat. No. 3,353,955 discloses image reproduction using a three-layer material comprising two flexible films separated by a very thin film of a photopolymerisable composition. The cohesion of that composition, in both exposed and unexposed states, is greater than its adhesion to either of the flexible films, but in its unexposed state, it adheres to one film more strongly than to the other and in its exposed state it adheres to the other more strongly than to the one. Accordingly, such a material may be developed after imagewise exposure by simply peeling apart the two substrates, exposed portions of the interlayer adhering to one and unexposed portions adhering to the other.

Such a system is not without disadvantages hindering its practical application. If the image is to be visible, the photopolymerisable interlayer must be coloured, but the introduction of a dye or pigment into that layer renders it more difficult to effect photopolymerisation in exposed areas thereof. Also, if there is too little dye or pigment, the images formed are of low opacity. Increasing the dye or pigment concentration to offset this leads to a decrease in the speed of the photosensitive layer and to unacceptably long exposure times. In addition, since the layer must shear at the boundaries between exposed and unexposed areas, it must not be too strong i.e. not too cohesive. The delicate balance of adhesive and cohesive properties required for workable material is sometimes difficult to obtain. On top of this, if the layer is too thick, it does not shear very cleanly and edge definition in the images produced is unsatisfactory.

An alternative approach is described in U.S. Pat. No. 3,060,025. In that specification, a method is described in which a photosensitive tacky layer is light cured in parts on imagewise exposure, and uncured parts (which remain tacky or thermally transferable) and an image-forming layer e.g. of carbon black on a substrate, may then be caused to give a visible image using a heat transfer stage. The process described is complex and does not lead to images of high optical density.

U.S. Pat. No. 3,615,435 discloses a further approach in which a photohardenable image reproduction element consists of a support, a layer of clear photohardenable material on the support and a layer of coloured photohardenable material on top of the clear photohardenable material. A receptor sheet covers the layer of coloured photohardenable material and after imagewise exposure, peeling support and receptor apart gives rise to positive and negative images. Pigmented photopolymer layers are difficult to cure fully without long irradiation but if long irradiation times are used in exposure, the image definition of such materials becomes unacceptable.

British Patent Specification No. 1,532,307 discloses a sandwich and peel apart technique for the production of dry transfers in which between the two sheets which may be peeled apart there are two layers, the first of a photopolymerisable material and the second of a frangible non-photopolymerisable image-forming layer. Prior to exposure, peeling the sheets apart results in cohesive failure of the photopolymerisable material layer with the whole of the image-forming layer remaining upon the carrier sheet to which it is closest. On exposure to actinic radiation, however, the photopolymerisable layer changes to constitute a hardened portion which, on peeling apart the carrier sheets, pulls away the underlying portion of the image-forming layer.

Materials such as those disclosed in Specification No. 1,532,307 may be manufactured without great difficulty but they suffer from a number of disadvantages in use. In particular, cohesive failure of the unexposed photopolymerisable layer leads to unexposed photopolymerisable material on both of the two sheets obtained by peeling the material apart and either must accordingly be subjected to a post-treatment in order to harden the tacky photopolymerisable layer before it can be used.

British Patent Specification No. 2,029,039A describes photosensitive materials which can be used in a negative working system for the production of dry transfers. According to this specification, images are reproduced using photosensitive material comprising, in order, a first carrier sheet, a photosensitive layer, a non-photosensitive image-forming layer and a second carrier sheet, wherein on imagewise exposure of the material and peeling apart of the sheets the non-photosensitive image-forming layer is caused to shear imagewise, and wherein, on peeling apart the sheets prior to exposure, the photosensitive layer and non-sensitive image-forming layer are both retained wholly on the second carrier sheet, and after exposure the photosensitive layer and at least part of the non-photosensitive image-forming layer are retained on the first carrier sheet. This photosensitive material is imagewise exposed and then developed by peeling apart of the carrier sheets.

The photosensitive materials of British Patent Specification No. 2,029,039A are suitable for the production of dry transfers if the shearable image-forming layer contains permanently relatively non-tacky adhesive sufficient to adhere the image formed on to a desired substrate. Alternatively the photosensitive layer may be so formulated that after exposure it, together with the sheared portion of image-forming layer overlying it, constitute a releasable indicium. Further adhesive may be incorporated into the photosensitive material between the image-forming layer and the second carrier sheet. The adhesive layer must be such that on peeling apart of the carrier sheets at least part is retained on those areas of image-forming layer which are pulled away with the first carrier giving a negative transferable image. In another form the adhesive may be applied in a separate step to the exposed and peeled apart material prior to use as a dry transfer.

Attempts have been made to develop imaging systems to obtain positive images using ingredients which loosen exposed material from a support. In this connection British Patent Specification Nos. 1,604,525 and 2,020,836A describe imaging methods which employ gas-generating substances. British Patent Specification No. 1,604,525 describes the use in the preparation of both positive and negative images of a multi-layered sheet construction comprising, in order, a first substrate, an energy sensitive layer capable of gas generation, and separate imaging and adhesive layers or a single imaging and adhesive layer, and a second substrate. This sheet construction is imagewise exposed causing loosening of the energy sensitive gas-generating layer from the first substrate in the exposed areas and then peeled apart to give the desired images. The specification is particularly concerned with the production of images for use in lithographic printing.

British Patent Specification No. 2,020,836A similarly uses a gas-generating substance. This specification relates to the production of dry processable lithographic printing plates using a multi-layered sheet construction capable of reproducing both positive and negative images which comprises a first support, a first photosensitive layer comprising a light sensitive gas-generating diazonium substance, an image-forming layer, a second photosensitive layer comprising a non-gas-generating light sensitive diazonium layer, and a hydrophilic bottom support. This sheet construction is imagewise exposed causing in the exposed areas gas generation in the first photosensitive layer and thus lowering the adhesion of the image-forming layer to the first support and the material of the second photosensitive layer to insolubilise. Peeling apart of the two supports results in the formation of a positive image on the first support and a negative image usable as a lithographic plate on the bottom support.

Proposals have also been made to prepare dry transfers by increasing the releasability of an image from its support by subjecting to a second exposure step. Thus U.S. Pat. No. 4,291,114 describes the production of dry transfers using a composite material comprising a transmissive cover sheet having an oleophilic surface and a base sheet having an oleophobic surface having therebetween a single photopolymerisable image-forming layer containing a cationically polymerisable organic material and an initiator therefor. On imagewise exposure and peeling apart of the so-exposed composite, in the non-exposed areas, the photopolymerisable layer material adheres to the cover sheet while in the exposed areas the photopolymerised layer material adheres to the base sheet. The final transfer is then obtained by rendering the non-exposed areas transferable from the cover sheet by exposing them to actinic radiation to give a positive transferable image.

Similarly British Patent Specification No. 1,336,065 describes the production of dry transfer sheets using multi-layer photosensitive materials which may be constructed as a pair of separable support films separated by one or more of interlayers. The interlayer(s) comprise pigment, binder, an adhesive (in the interlayer furthest from a first of the support films if there is more than one interlayer) and a light sensitive substance capable of generating gas on exposure to light (in the interlayer nearest the first support if there is more than one interlayer). This multi-layered material is imagewise exposed and the adhesion to the first support is lowered due to the effect of gas generated by the decomposition of the light sensitive substance. Peeling apart of the supports results in the unexposed material remaining adherent to the first support while the exposed material, loosened by the gas generation, is removed on the other support film to leave a positive image on the first support. The positive image is rendered transferable by a second exposure step whereby the gas generation caused lowers the image adhesion to its support. This reduction in adhesion enables easy transfer to the images particularly if they contain or are coated with adhesive. However in use with this system it is generally found that the bubbles of gas which are generated to permit release of the image from its support tend to collapse after a relatively short time, e.g. from a few hours to a few days, and image transfer is thereby lost. Also if transfer is accompanied by the application of substantial pressure, such as that derived from a stylus, than again the bubbles collapse and, paradoxically the image transfer becomes more difficult the greater the pressure used.

THE SUMMARY OF THE INVENTION

According to the present invention, there is provided a photosensitive material for use in the making of dry transfer materials comprising in order a first transparent or translucent, flexible carrier sheet, a first photosensitive layer which is photocrosslinkable or photopolymerisable, a shearable image-forming layer, an adhesive layer which is a permanently tacky pressure-sensitive adhesive composition or which is capable of becoming a permanently tacky pressure-sensitive adhesive composition on exposure to light, and, adjacent the adhesive layer, a second flexible carrier sheet, which second carrier sheet is transparent or translucent at least when the adhesive layer is photosensitive, the ease with which the first photosensitive layer may be removed from the first carrier sheet being increased under the action of actinic radiation.

DETAILED DESCRIPTION OF THE INVENTION

The present invention provides multi-layered photosensitive materials which are highly effective for the manufacture of dry transfer materials by peeling apart to develop an image after imagewise exposure and subsequently subjecting to a second exposure step. The materials according to the present invention are positive working. The transferable images obtained according to the present invention comprise photocrosslinked or photopolymerised material derived from the the first photosensitive layer loosened from its first carrier sheet support in the second exposure step, image-forming material and adhesive.

The materials according to the present invention may be used in two basic ways depending upon whether the adhesive layer is photosensitive and capable of increasing its adhesion to the layers on either side of it and/or of increasing its internal cohesion on exposure to actinic radiation or whether it is merely a permanently tacky layer of more or less adhesive material.

In the first case, contact exposure through a positive of the desired image with the positive adjacent the second carrier causes the adjacent photosensitive adhesive layer in the exposed areas to harden and bond and/or have increased cohesion relative to the adhesive in the unexposed areas. The individual layers of the material are so formulated that in unexposed areas the photosensitive adhesive layer fails co- or adhesively when the two carrier sheets are peeled apart while in exposed areas the photosensitive adhesive layer has become so much stronger that it holds both the image-forming layer and, if desired, the photosensitive coating to the second carrier. Thus, on peeling apart, the first carrier retains image areas corresponding to the opaque areas of the photographic positive each of which consists of a photosensitive coating adjacent that carrier (which coating on exposure to actinic radiation becomes easier to remove from that carrier), an image-forming layer and a layer of unexposed photosensitive adhesive composition thereover. On exposure of both sides of this material to actinic radiation the photosensitive layer adjacent the carrier sheet is photopolymerised or photocrosslinked and becomes easier to remove from the carrier sheet while the photosensitive adhesive composition cures to form a final stable slightly tacky pressure-sensitive adhesive. The product resulting from this second overall exposure is accordingly a dry transfer, since the photosensitive adhesive layer and the polymerised or photocrosslinked layer adjacent the carrier are so formulated that after such a second exposure the individual image areas may be transferred to a desired receptor surface in the usual way. In this connection, transfer may occur solely by the bonding power of the permanently tacky adhesive remote from the carrier overwhelming the bond of the photosensitive layer to the carrier, or use may be made of the so-called stretch-release technique disclosed in British Patent Specification No. 959,670. In this latter technique the bulk physical properties of the finally exposed layer are such that on local manipulation of the carrier sheet e.g. using a stylus, the stretching of the carrier sheet which occurs provokes release of the image from the carrier sheet.

Alternatively, where the adhesive layer is not photosensitive, the photosensitive material of the invention may be contact exposed through a positive adjacent the first carrier sheet adjacent the photosensitive coating. The adhesive layer is so formulated that in the case of the unexposed material, the adhesive bond between adhesive and second carrier sheet is insufficient to draw the image-forming layer away from the first carrier sheet. However, on exposure to actinic radiation, the photosensitive layer becomes sufficiently easier removed from the adjacent carrier sheet that it may be so removed by the pulling power of the adhesive layer together with the areas of image-forming layer between the photosensitive layer and the adhesive layer.

Thus, on positive imagewise exposure and peeling apart, the first carrier sheet (adjacent the photographic positive) bears a plurality of image areas each of which consists of an unexposed photosensitive layer, an image-forming layer and an adhesive layer most remote from the first carrier sheet. By exposing this material to actinic radiation, the remaining areas of photosensitive layer become photopolymerised or photocrosslinked and are caused to become sufficiently easily removable from the carrier sheet that the material will then function easily as a dry transfer.

The photosensitive layer is thus initially of high adhesion for the substrate adjacent it and relatively low rigidity or of internal cohesion. After exposure, the rigidity of the layer is increased, its adhesion is lowered and its cohesion raised. The initially high adhesion and/or low cohesion substantially improves the image definition obtainable.

BRIEF DESCRIPTION OF THE DRAWINGS

The two alternative ways of using the photosensitive materials of the present invention are illustrated diagrammatically in the accompanying drawings, in which:

FIG. 1 shows diagrammatically the stages of exposure, peel apart and second exposure of a material in which the imaging layer is sandwiched between two photosensitive layers; and FIG. 2 shows diagrammatically the exposure, peeling apart and subsequent exposure of an alternative embodiment.

DETAILED DESCRIPTION OF THE DRAWINGS

With reference to FIG. 1, the photosensitive material comprises two transparent or translucent flexible carrier sheets 1 and 2, between which are successively a layer 3 of a photosensitive composition, which is photocrosslinkable or photopolymerisable and which becomes more easily removable from carrier 1 on irradiation with actinic radiation, an image-forming layer 4 and a layer 5 of photosensitiveadhesive adjacent carrier 2. This material is imagewise exposed to actinic radiation using a photographic positive 6 in contact with carrier 2. The imagewise exposed material is then peeled apart to give a negative image on carrier 2 and a positive image on carrier 1. The positive image is then exposed to actinic radiation from both sides to give the final dry transfer material.

Referring to FIG. 2, adjacent carrier 1 is a photosensitive layer 3 and next an image-forming layer 4 both as in FIG. 1. However there is a third layer denoted 7 which is a layer of a slightly tacky permanent tack pressure-sensitive adhesive before the carrier 2. This material is imagewise exposed to actinic radiation using the photographic positive 6 in contact with carrier 1.

The imagewise exposed material is then peeled apart to give a positive image on carrier 1 and a negative image on carrier 2. The positive image is then exposed to active radiation through carrier 1 to give the final dry transfer material.

A wide variety of materials may be used to form the layers between the flexible carrier sheets. Some of the Specifications referred to above, especially British Patent Specification No.: 2,029,039A, give examples of suitable film-forming materials for use in making interlayers of this type.

The photosensitive coating is capable of crosslinking and/or polymerising under the influence of actinic radiation. Preferably an ethylenically unsaturated system is used. The photosensitive coating is preferably composed of a cross-linking unsaturated monomer together with a photoinitiator and preferably also a crosslinkable oligomer and a polymeric binder.

The photoinitiator used may be selected from a variety of chemical compounds which on exposure to actinic radiation yield free radicals or fragments that can be reduced to free radicals. Materials which have been found to be of particular value include chlorothioxanthones, benzoin ethers, benzil and benzil derivatives, acetophenone and acetophenone derivatives and anthraquinones. If desired activators may be included in the layer to improve the efficiency of free radical production, for example various amine derivatives and Michler's Ketone. A wide variety of appropriate materials and mixtures is described in the literature, notably U.S. Pat. No. 3,353,955, and other U.S. Pat. specifications referred to therein.

The cross-linking unsaturated monomer is preferably an unsaturated polyfunctional acrylate.

The crosslinkable oligomer may be any of those widely known from the field of ultra-violet irradiation curing inks.

Preferably the photosensitive coating also comprises a polymeric binder material, optionally together with a plasticiser. By varying the type and proportions of such polymeric binder and plasticiser in conjunction with varying photoinitiator/unsaturated monomer/crosslinkable oligomer systems, a wide range of adhesions between the photosensitive coating and the carrier may be achieved. On irradiation with appropriate light, particularly ultra-violet light, the plasticising effect of the photo-active components in the photosensitive coating is substantially reduced, facilitating its release from the substrate. This increase in releasability, arising from an increased cross-linking or polymerisation and an increase in the rigidity of the layer, facilitates transfer of the desired images by the stretch release mechanism described in British Patent Specification No. 959,670.

It will be appreciated that the behaviour of the photosensitive coating depends not only on the intrinsic properties of that coating but also on the properties of the flexible carrier sheet to which it is adjacent. In particular, the behaviour depends on the surface properties of the carrier, and can be modified substantially if the carrier has a surface treatment or carries a subbing or like layer. Simple tests can be carried out to determine suitable formulations of the photosensitive layer for use with a given carrier.

The image-forming layer is preferably one which interacts at most very little with the layers on either side of it. Preferably it consists simply of a polymeric binder having a pigment and/or dyestuff dispersed or dissolved therein. In particular this layer is preferably non-photosensitive for best resolution of the image.

The layer of photosensitive adhesive when used may be made by incorporating into a basic photo-hardenable composition of a polymeric permanently tacky pressure-sensitive adhesive component.

The flexible carrier sheets may be made from a wide variety of materials known for use as carrier sheets, most usually treated papers and plastics foils. At least one of the sheets and conveniently both should be transparent or translucent to radiation, particularly ultra-violet light. Preferred carrier sheets are flexible plastics films of polyethylene terephthalate, polyethylene, polystyrene or cellulose acetate.

When the adhesive layer of the photosensitive material is a permanently tacky layer of adhesive material particular care needs to be taken to ensure good removal of the photosensitive layer material (and the image-forming layer material) in the exposed areas from the adjacent first carrier sheet under the pulling power of the adhesive layer when the imagewise exposed material is peeled apart. For this purpose it is preferred that the first carrier is provided, on its side adjacent the photosensitive layer, with a release layer e.g. of polytetrafluoroethylene.

The following Examples will serve to illustrate the invention:

EXAMPLE 1 (FIG. 1 type)

The following coating compositions were made up:
Coating composition 1, photosensitive coating:

|  | Parts by weight |
| --- | --- |
| Epoxy acrylate oligomer (Ebecryl 600 ex UCB S.A.) | 323 |
| Oligotriacrylate (Ebecryl OTA 480 ex UCB S.A.) | 80 |
| Surfactant (Ethoxylated Sorbitan ether HLB 15; Tween 80 ex Honeywill Atlas) | 10 |
| Surfactant (Ethoxylated Sorbitan ether HLB 4.5: Span 80 ex Honeywill Atlas) | 3 |
| Photoinitiator (Solution of 2-isopropylthioxanthone (Quantacure ITX) in a tertiary amine; Quantacure 659 ex Ward Blenkinsop Ltd.) | 48 |
| Water | 232 |
| Polyvinyl acetate homopolymer emulsion (Mowlith DHL ex Harlow Chemicals) | 139 |

Coating composition 2, (image-forming layer composition):

|  | |
| --- | --- |
| Polyamide (Versamid 754 ex Cray Valley Products) | 20 |
| Carbon black (Elftex 150 ex Cabot Carbon) | 30 |
| Toluene | 125 |
| Isopropyl Alcohol | 15 |

Coating composition 3, (photosensitive composition):

|  | |
| --- | --- |
| Epoxy acrylate oligomer solution (50% by weight Ebecryl 600 ex UCB S.A. in methanol) | 80 |
| Oligotriacrylate (Ebecryl OTA 480 ex UCB S.A.) | 10 |
| Photoinitiator (Quantacure 659 ex Ward Blenkinsop Ltd.) | 6 |
| PVC interpolymer solution (Vinylite VMCH, 10% by weight solution in butan-2-one ex Bakelite Xylonite Ltd.) | 34 |

A photosensitive material was made by coating Coating Composition 2 using a wire wound bar of wire 0.25 mm diameter onto silicone release paper (30/111 ex Jointine Products Limited). After drying this first layer, Coating Composition 1 was coated thereover using a wire wound bar of wire diameter 0.36 mm and the second coating dried. After drying, a 0.1 mm thick polyethylene sheet was applied to the second coat and the silicone release paper then stripped away.

Coating Composition 3 was coated at a coating rate of approximately 10 gsm on 0.075 mm thick polyethylene terephthalate sheet (Melinex 542 ex I.C.I.) and after drying the coating it was laminated on to the now exposed coating of coating composition 2 to form a two-carrier sheet/three interlayer photosensitive material according to the invention.

In order to test this material, it was imagewise exposed through an image-bearing transparency in contact with the polyethylene terephthalate carrier for 15 seconds. The exposure source was a 2 kw mercury metal halide lamp 1 m away from the transparency. Following exposure the polyethylene and polyethylene terephthalate sheets were peeled apart and the images on the polyethylene sheet were then further cured by exposing to radiation from the 2 kw lamp first for 10 seconds from the side carrying the images and then for 60 seconds through the polyethylene carrier sheet. This latter exposure hardened the layer formed from Coating Composition 1 sufficiently that the so-exposed material could be used in the normal way as a dry transfer sheet.

EXAMPLE 2 (FIG. 2 type)

Coating compositions were made up as follows:
Coating composition A, (adhesive composition):

A masterbatch adhesive was prepared by dispersing the following components until homogeneous using a high shear stirrer:

| | Parts by weight |
|---|---|
| Low molecular weight polybutene (mixed feed stock) (Hyvis 200 ex B.P. Chemicals) | 400 |
| Oppanol B50 (20% in Exsol 145/160) (a polyisobutylene (medium molecular weight) ex B.A.S.F.) | 600 |
| Fumed Silica (Aerosil 300 ex Degussa Limited) | 280 |
| Glycerol ester of hydrogenated rosin (Stabelite Ester 10 ex Hercules Powder Co.) | 160 |
| Electroneutral salt of polycarbonic acid with amine derivatives dissolved in approximately 50% higher aromatics (Product 963 ex Henkel Chemie) | 4 |
| 2-Ethoxy-ethanol | 80 |
| Aliphatic hydrocarbon solvent with low aromatic content quoted evaporation range 145–160° C. (Exsol 145/160) | 5000 |

This masterbatch adhesive composition was used to prepare Coating composition A by stirring until homogeneous the following components:

| | Parts by weight |
|---|---|
| Masterbatch adhesive | 500 |
| Exsol 145/160 (as in Masterbatch) | 350 |
| DC 282 (60% non-volatile silicone adhesive in toluene/xylene ex | 12 |

| -continued | |
|---|---|
| | Parts by weight |
| Dow Corning) | |

Coating composition B, (image-forming layer composition)

The following ingredients were stirred together until solution of the polyamide was complete:

| Part A. | Parts of weight |
|---|---|
| Polyamide (Versamid 758 ex Cray Valley Products) | 100 |
| Xylene | 500 |
| 2-Ethoxy-ethanol | 100 |

Using a high shear stirrer until the pigment was evenly dispersed the following ingredients were mixed:

| Part B. | Parts by weight |
|---|---|
| Part A | 425 |
| Carbon black (Elftex 150) | 75 |

Stirring was continued and there was added successively:

| | Parts by weight |
|---|---|
| 2-Ethoxy-ethanol | 50 |
| Xylene | 200 |

Stirring was continued until the dispersion thickened.
Coating composition C, (photosensitive composition):

The following ingredients were stirred until homogeneous solution was obtained.

| | Parts by weight |
|---|---|
| 20% Solution in butan-2-one of Elvacite 2008 (a methyl methacrylate polymer ex Du Pont) | 30 |
| Photoinitiator [13% solution of 2-isopropylthioxanthone (Quantacure ITX) in 2-(n-butoxy)-ethyl-4-dimethylaminobenzoate (Quantacure BEA) ex Ward Blenkinsop Ltd.] | 2.4 |
| Setalin AM 548 (dianol 22 diacrylate ex Synthese B.V.) | 30 |
| Butan-2-one | 10 |

Coating composition D, (release layer composition):
The following ingredients were stirred to give a homogeneous coating solution:

| | Parts by weight |
|---|---|
| Fluorotelomer dispersion in trichlorotrifluoroethane, (Vydax AR ex Du Pont) | 100 |
| Dichloromethane | 200 |

A photosensitive material was made as follows:
Coating composition A was coated on to the siliconised surface of a first carrier of siliconised, polyethylene coated Kraft paper (30/102 ex Jointine Products Limited) using a Meyer bar with a 0.45 mm wire wrapping at a speed of 4.6 meters per minute. After drying at 75°–80° C., there was coated on top of the first layer, Coating composition B using a rotating Meyer bar with a 0.25 mm wire wrapping at a web speed of 3 meters per minute. The composite was then dried at 70°–80° C. There was then applied Coating composition C to the already coated surface at a speed of 1.5 meters per minute using a rotating Meyer bar with a 0.45 mm wire wrapping and the whole was dried at 45°–50° C.

Coating composition D was coated on to a second carrier of 0.075 mm thick polyethylene terephthalate sheet (Melinex 542) using a Meyer bar with a 0.20 mm wire wrapping at a web speed of 3 meters per minute and then dried at 40°–50° C.

The coated surfaces of the two carriers were laminated together using an oil or electrically heated nip roller with a roller surface temperature of 65°–70° C.

The photosensitive material thus obtained was imagewise exposed to an interposed positive master through the polyethylene terephthalate carrier to a UV rich light source (e.g. to the 2 kw mercury metal halide lamp used in Example 1 at 1 m for 10 seconds). After exposure the photosensitive material was laid flat with the polyethylene terephthalate carrier uppermost. This carrier is peeled back smoothly from one edge (to approximate 180° peel). In the exposed areas the photosensitive layer does not adhere to the release coating of the carrier while in the unexposed areas the photosensitive layer remains attached to the release coating and the image-forming layer and adhesive layers remain attached to the unhardened photosensitive layer in the exposed layer. The image-bearing polyethylene terephthalate carrier is re-exposed to the UV light source for 20 seconds to harden the unexposed photosensitive layer. The hardened images so-formed are transferable using conventional rub down techniques.

We claim:

1. A photosensitive material for use in the making of dry transfer material which comprises in order a first transparent or translucent, flexible carrier sheet, a first photosensitive layer which is photocrosslinkable or photopolymerisable, a shearable image-forming layer, an adhesive layer which is a permanently tacky pressure-sensitive adhesive composition or which is capable of becoming a permanently tacky pressure-sensitive adhesive composition on exposure to light, and, adjacent the adhesive layer, a second flexible carrier sheet, which second carrier sheet is transparent or translucent at least when the adhesive layer is photosensitive, the ease with which the first photosensitive layer may be removed from the first carrier sheet being increased under the action of actinic radiation.

2. A photosensitive material according to claim 1 wherein the adhesive layer is photosensitive and increases its adhesion to the layers on either side of it and/or cohesion on exposure to actinic radiation.

3. A photosensitive material according to claim 1 wherein the adhesive layer is non-photosensitive.

4. A photosensitive material according to claim 3 wherein the first carrier sheet has, on its side adjacent the said photosensitive layer, a release coating of polytetrafluoroethylene.

5. A photosensitive material according to claim 1 wherein the photosensitive layer material is ethylenically unsaturated.

6. A photosensitive material according to claim 1 wherein the image-forming layer is non-photosensitive.

7. A method of making a dry transfer material which method comprises imagewise exposing a photosensitive material, which comprises in order a first transparent or translucent, flexible carrier sheet, a first photosensitive layer which is photocrosslinkable or photopolymerisable, a shearable image-forming layer, an adhesive layer which is capable of becoming a permanently tacky pressure-sensitive adhesive composition on exposure to light, and, adjacent the adhesive layer, a second transparent or translucent flexible carrier sheet, the ease with which the first photosensitive layer may be removed from the first carrier sheet being increased under the action of actinic radiation, to actinic radiation through the said second carrier sheet, peeling the first and second carrier sheets apart to develop the image, and subsequently exposing the image areas of photosensitive adhesive, image-forming material and photosensitive material remaining on the first carrier sheet to actinic radiation from both sides to give a dry transfer material.

8. A method of making a dry transfer material which method comprises imagewise exposing a photosensitive material, which comprises in order a first transparent or translucent, flexible carrier sheet, a first photosensitive layer which is photocrosslinkable or photopolymerisable, a shearable image-forming layer, an adhesive layer which is a permanently tacky pressure-sensitive adhesive composition, and, adjacent the adhesive layer, a second flexible carrier sheet, the ease with which the first photosensitive layer may be removed from the first carrier sheet being increased under the action of actinic radiation, to actinic radiation through the said first carrier sheet, peeling the first and second carrier sheets apart, and exposing the image areas of photosensitive, image-forming and adhesive material remaining on the first carrier to uniform radiation through the first carrier to give a dry transfer material.

* * * * *